United States Patent [19]
Hong

[11] Patent Number: 6,026,037
[45] Date of Patent: Feb. 15, 2000

[54] REPAIR CIRCUIT OF MEMORY CELL ARRAY

[75] Inventor: Chi-Cheng Hong, Hsin-Chu, Taiwan

[73] Assignee: Utron Technology Inc., Hsin-Chu, Taiwan

[21] Appl. No.: 09/240,821

[22] Filed: Feb. 1, 1999

[51] Int. Cl.[7] .................................................... G11C 7/00
[52] U.S. Cl. ......................... 365/200; 365/225.7; 326/40
[58] Field of Search ............................... 365/200, 225–7, 365/154, 185.09; 326/40, 46

[56] References Cited

U.S. PATENT DOCUMENTS

| | | | |
|---|---|---|---|
| 5,262,994 | 11/1993 | McClure | 365/225.7 |
| 5,907,513 | 5/1999 | Kato | 365/200 |
| 5,912,841 | 6/1999 | Kim | 365/225.7 |

*Primary Examiner*—Tan T. Nguyen
*Attorney, Agent, or Firm*—H. C. Lin Patent Agent

[57] ABSTRACT

A low power repair circuit for a memory matrix is achieved by using two cross-coupled 2-input CMOS OR-gates to form a precharged flip-flop, using two PMOS as drivers. The first OR-gate has a load device comprising a number of parallel branches, each having an NMOS switch in series with a fuse. There are twice as many branches as there are addresses in the predecoder for the memory matrix. Two such branches correspond to an address signal and its complement. The parallel branches are connected to ground through an enable switch and are pulled-down when the enable switch is closed by an enable signal. The fuses of the branches are cut according the address of the faulty word line. The gates of the NMOS switches in are connected to the addresses of the word line predecoder. The output of the first OR gate is precharged to be high. When a particular address has a faulty cell, the branches corresponding to the address of the faulty word line is not conductive due to the broken fuse, and the output of the first OR gate stays high due to precharge. The output of the second OR-gate is fed back to the first OR-gate to latch the flip-flop and is used to furnish a repair signal.

21 Claims, 3 Drawing Sheets

REPAIR CIRCUIT OF MEMORY CELL ARRAY

BACKGROUND OF THE INVENTION

This invention relates to semiconductor memory, in particular to a redundant circuit in a memory cell array to repair a defective cell.

In a memory cell array, there are a large number of memory cells. As demand and technology progress, the memory size and chip size also increase. With increased chip size, the likelihood of having a defective cell in the chip becomes greater. While there has been constant effort to improve the yield of production, another remedy is to use circuit approach.

When one of the cells is defective, the memory chip cannot function properly. It is customary to incorporate redundant word line(s) in the memory chip to replace the line where there is a defective cell such as that described in U.S. Pat. No. 4,571,707. On such redundant circuit block diagram is shown in FIG. 1. When the memory chip receives data to be stored in normal operating condition, the X address signal XA picks one out of n-inputs to feed an X address predecoder 32X to select one of $2^n$ word lines. Meanwhile the Y address signal YA selects one of m-addresses of a Y-predecoder 31Y to feed a Y address decoder 32Y which selects one of $2^m$ column. With coincident addressing, a $2^n*2^m$ addressable memory matrix is obtained. The input data is stored in the one addressed memory cell out of the $2^n*2^m$ memory cells matrix.

If there is defective memory cell, the X-control circuit 33X activates an X-repair circuit 34X or the Y-control circuit 33Y activates a Y-repair circuit 34Y. For example, when a memory chip is found by factory testing to have a defective memory cell at location [1,1] . . . [1,2] word line, the location is recorded in the X-control circuit 33X which is activated at the appropriate time to remedy the defective word line WL[1]. When thee new address signal arrives and if the address coincides with that of the word line WL[1] (such as 0001 etc), the X control circuit 33X produces an enable signal Fuen X (function enable) to activate the X-repair circuit 34X. The Fuen X signal feeds the X-repair circuit 34X to generate a repair signal RX. The RX signal deactivates the original X address in the decoder 32X so that the normal word line in 32X cannot be activated, but activates a spare word line in the memory matrix 3 to replace the original defective word line. Thus the repair function is accomplished.

FIG. 2 shows a circuit diagram of a conventional repair circuit (such as 34X). A number of n-type MOSFETs (NMOS) 104–107 are connected in parallel each through a fuse F11, F12, F13, F14 respectively between a ground and a common node A, which is connected to the common drain of a CMOS inverter having a PMOS 102 and an NMOS 122. The gates of the NMOS 104–107 are separately connected to the input addresses of the predecoder (such as 31X), e.g. A[0], A[0]B, A[1], A[1]B, A[2], A[2]B, A[3], A[3]B for 4 input address. The common gate of the CMOS inverter 102/122 is connected to the output of inverter 101, which receives the FuenX enable signal from the X control circuit 33X. The inverter 101 also drives the common gate of another CMOS inverter comprising PMOS 103 and NMOS 123. The common drain the 103 and 123 drives another common node B. Between node B and the ground are connected in parallel another set of NMOS 108–111 each in series with a fuse F15, F16, F17,F18 respectively. The nodes A and B are connected to a NAND gate 112 which feeds inverter 113.

In operation, the fuses F11–F18 can be rendered nonconductive (open) either electrically or mechanically. When the control circuit feeds a high ("1") Fuen enable signal to inverter 101, PMOS 102 and 103 are turned on. If none of the series NMOS and fuse paths of NMOS between node A and ground is conducting, the node A is pulled up to "1" level. Similarly, the same is true for node B. When, the output nodes A and B are set in high logic level "1", a high RX signal is generated.

For example, if the address 1111 in the memory matrix is defective, the fuses F11, F13, F15, F17 are made nonconductive and the fuses F12, F14, F16, F18 are made conductive. Then, when Fuen enable signal is fed to inverter 101 and the addresses of the predecoder is 1111 (i.e. A[0]=1, A[0]B=0; A[1]=1, A[1]B=0; A[2]=1, A[2]N=0; A[3]=1, A[3]B=0), the NMOS 104, 106, 108, 110 are turned on but their respective series fuses are preset to be broken. On the other hand, the NMOS 105, 107, 109, 111 are not turned on, while their respective series fuses are not broken. Thus none of the NMOS 104–111 are conducting, and both the node A and B are pulled up to logic "1" level. The high logic level "1" of node A and node B renders the output of the NAND 112 to be low and the output RX of the inverter 113 to be high.

However, when the address to the repair circuit shown in FIG.2 is other than 1,1,1,1 at least one of the series NMOS and fuse is conducting. The conducting current consumes power. When the memory is large, the power consumption can be significant.

SUMMARY

An object of this invention is to provide redundancy in a memory integrated circuit. Another object is to provide redundancy in a memory array with low power dissipation.

These objects are achieved in this invention by using two cross-coupled 2-input OR gates to form a precharged flip-flop, using two PMOS as the 2-input pull-up devices. The first OR gate has a load device comprising a number of parallel branches, each having an NMOS in series with a fuse. There are twice as many branches as there are addresses in the predecoder. Two branches correspond to an address signal and its complement. These parallel branches are connected to ground through an enable switch and .can be pulled-down when the enable switch is closed by an enable signal. The fuses of the branches branch are cut according to the address of the faulty word line. The gates of the NMOS in these branches are connected to the addresses of the word line predecoder. The output of the first OR gate is precharged to be high. When a particular address has a faulty cell, the branches corresponding to the address of the faulty word line is not conductive due to the broken fuse, and the output of the first OR gate stays high due to precharge. The output of the first OR is coupled to the second the second inverter, the output of which is outputted to activate the repair circuit and fed back to the first OR gate to latch the flip-flop.

DETAILED DESCRIPTION OF THE PREFERRED EMBODIMENT

Figure 1:
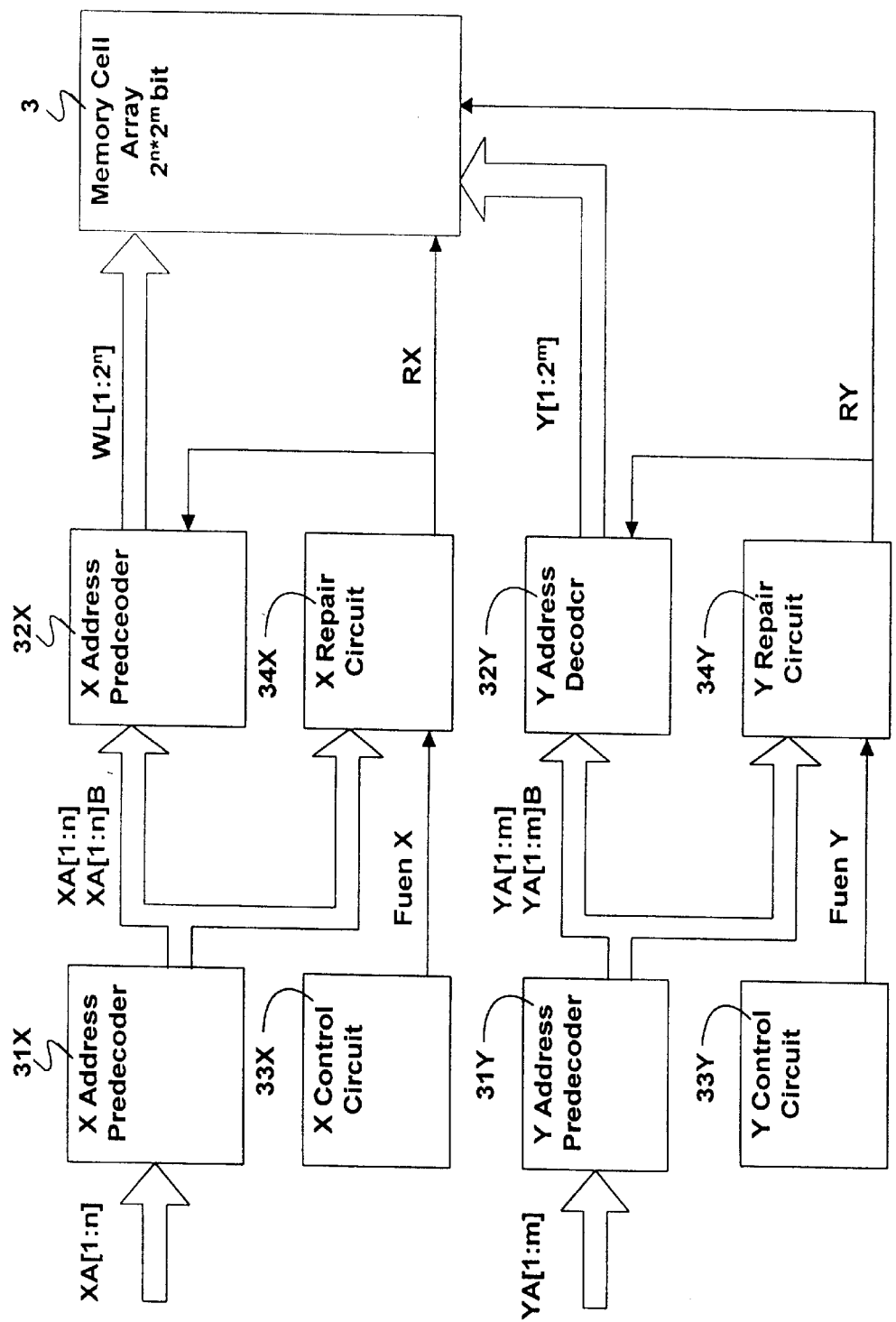
FIG. 1 shows a block diagram of memory system having provision to repair a defective cell.
Figure 2:
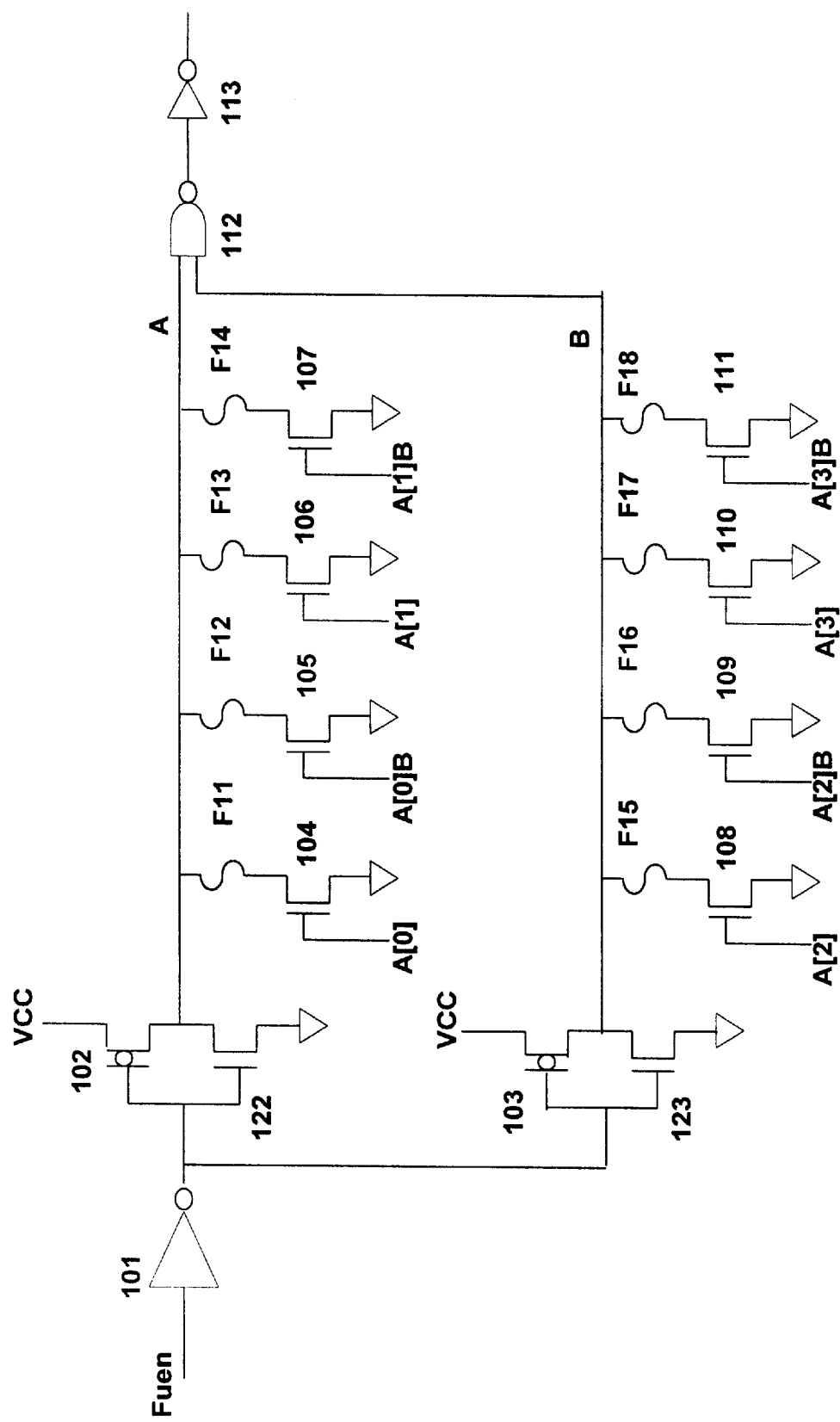
FIG.2 shows a repair circuit for replacing a defective row of memory cells
Figure 3:
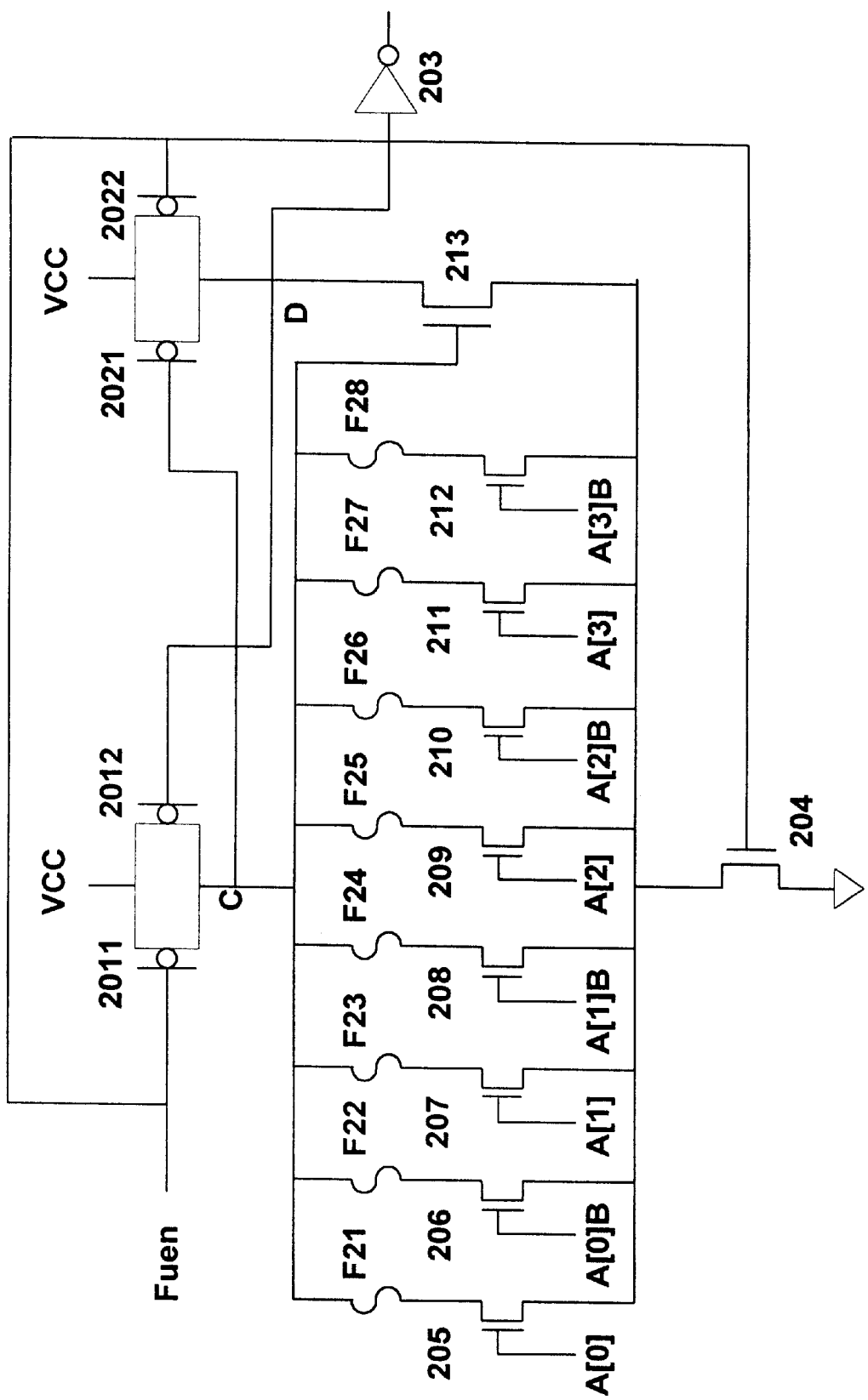
FIG.3 shows the repair circuit of the present invention.

The repair circuit of the present invention is shown in FIG.3. The PMOS 2011, 2012 forms a first OR gate 201, and the PMOS 2021, 2022 forms a second OR gate 202. The sources of these PMOS are connected to a positive power supply. The output of the first OR is at node C and the output of the second OR gate is at node D. A number of parallel NMOS in series a fuse are connected to node C as pull-down load devices of the OR gate 201. The common sources of these NMOS are connected to the drain of an NMOS switch 204 with its source connected to ground and its gate controlled by the Fuen ennable signal. The second OR gate 202 is connected through a pull-down load device NMOS 213 to the drain of NMOS 204. The gate of the NMOS 213 is connected to node C. The output of the second OR gate 202 at node D is connected to the gate of PMOS 2012 and the input of the output inverter 203. The Fuen enable signal for the Repair circuit is also connected to the PMOS 2011 of the OR gate 201 and to the PMOS 2022 of inverter 202. The gates of the NMOS 205-212 are connected to the same addresses of the predecoder 31X, A[0], A[0]B; A[1], A[1]B; A[2], A[2]B; A[3], A[3]B. The series fuses for NMOS 205–212 are respectively F21–F28.

The operation is as follows: When the enable signal Fuen is at "0" level, the PMOS 2011, 2022 are turned on, but the switch 204 to ground is open. Nodes C and D are precharged at high logic "1" level. This high "1" level is inverted to a low output RX by the inverter 203. When Fuen goes high and fuses F21, F23, F25, F27 are open, the address signal for the predecoder 1,1,1,1 cannot make the NMOS 206, 208, 210, 212 to conduct, and the node C remains at a high "1" level to turn on NMOS 213 and pull down node D. Then the RX output of the inverter 203 goes high to actuate the repair circuit. Meanwhile the pulled-down node D turns on PMOS 2012 to latch the two cross-coupled OR-gates 202 and 203. When the Fuen enable signal is high and the predecoder address is other than 1,1,1,1, then one the NMOS 206, 208, 210 and 212 is turned on to pull down the node C toward ground or "0" logic level to turn off the pull-down NMOS 213. Then the node D maintains at a high logic level 1, which renders the inverter 203 output RX low at "0" logic level. Meanwhile the high node D voltage is coupled back to the PMOS 2012 of the first OR-gate to latch the two cross-coupled OR-gates 202 and 203. Due to the fact, that all the PMOS are not conducting, there is no current to cause any power dissipation.

While the foregoing description explains the operation of a repair circuit for memory matrix, the circuit can serve more generally as a programmable decoder. By programming the fuses to correspond to a particular address, a high output can be obtained when the fuses corresponding to the particular address are cut. As to fuses, they can be fusible links, flash memory, EPROM or EEPRON.

While the foregoing FIG.3 is described in certain arrangement of PMOS and NMOS transistors, it is apparent that a dual arrangement interchanging PMOS/NMOS and power supply polarities can also be used. While the foregoing description deals with a defective word line, it should be understood that the same technique can be used to replace a defective bit line column. While the description is devoted to repairing defective memory cell, the circuit technique can have more general application as a programmable, precharged decoder. While the preferred embodiment has been shown, it is distinctly understood that the invention is not limited thereto but may be otherwise embodied within the scope of the following claims.

What is claimed is:

1. A programmable logic circuit, comprising:
    a flip-flop having two cross-coupled first 2-input logic gate and second 2-input logic gate, each said logic gate having a reset input and a cross-coupled input,
    said first 2-input logic gate having an output precharged to a first logic level before a reset signal is applied to said first logic gate, and having a load device comprising a plurality of parallel branches, each having a fuse in series with a switch,
    each of said switch being controlled by an address signal, and
    each said fuse corresponding to each said address signal being cut off by a previous program such that the branch controlled by said address signal is open-circuited and causing the flip-flop to remain in a condition where the output of said first 2-input logic is precharged to said first logic level, and
    an output terminal coupled to said second logic gate to reflect said condition.

2. A programmable logic circuit as described in claim 1, wherein said 2-input logic gate is an OR-gate.

3. A programmable logic circuit as described in claim 2, wherein said OR-gate is a CMOS OR-gate with two PMOS as pull-up input drivers connected to a positive terminal of a power supply.

4. A programmable logic circuit as described in claim 3, wherein the output of said first logic gate is precharged to a high logic level.

5. A programmable logic circuit as described in claim 4, wherein said switch is an NMOS.

6. A programmable logic circuit as described in claim 5, further comprising a second switch connected between the common end of said branches and the negative terminal of said power supply, and controlled by said reset signal.

7. A programmable logic circuit as described in claim 5, further comprising an inverter coupled to the output of said second OR-gate.

8. A programmable logic circuit as described in claim 1, wherein said programmable logic circuit is a repair circuit for replacing a defective word line in a memory matrix where the reset signal is an enable signal and the output of said flip-flop is used to furnish a repair signal.

9. A programmable logic circuit as described in claim 1, wherein said logic circuit is a repair circuit for replacing a defective bit line in a memory matrix wherein the reset signal is an enable signal and the output of said flip-flop is used to furnish a repair signal.

10. A programmable logic circuit as described in claim 1, wherein said fuse is selected from the group consisting from fusible link, flash-memory, EPROM and EEPROM.

11. A semiconductor memory having memory cells arranged in a matrix having
    a first set of lines,
    a second set of lines orthogonal to said first set of lines,
    memory cells located at the cross-points of said first set of lines and said set of lines,
    a row address predecoder for said first set of lines;
    a row address decoder addressed by said predecoder for selecting a line from said first set,
    a repair circuit for said first set to address a spare line from said first set to replace a defective line in said first set and to disable said defective line;
    a control circuit for storing the address of said defective line and producing an enable signal to activate said repair circuit when the address of the faulty line occurs,
    said repair circuit comprising:
        a flip-flop having two cross-coupled first 2-input logic gate and second logic gate,
        each said logic gate having a reset input and a cross-coupled input, said first 2-input logic gate having an output prechagred to a first logic level before an enable signal from said control circuit is applied to said reset input, and having a load device comprising a plurality of parallel branches, each having a fuse in series with a switch, each of said switch being controlled by the same address signal as the address signal of said defective line, and each said fuse corresponding to each said address signal being cut off by a previous program such that the branch controlled by said address of said defective line is open-circuited and causing the flip-flop to remain in a condition where the output of said first 2-input logic gate is precharged to said first logic level, and an output terminal coupled to said second logic gate to disable said defective row and to activate said spare row.

12. A semiconductor memory as described in claim 11, wherein said first set of lines are word lines.

13. A semiconductor memory as described in claim 12, wherein said OR-gate is a CMOS OR-gate with two PMOS as pull-up input drivers connected to a positive terminal of a power supply.

14. A semiconductor memory as described in claim 13, wherein the output of said logic gate is precharged to a high logic level.

15. A semiconductor memory as described in claim 14, wherein said switch is an NMOS.

16. A semiconductor memory as described in claim 15, further comprising a second switch connected between the common end of said branches and the negative terminal of said power supply, and controlled by said enable signal.

17. A semiconductor memory as described in claim 15, further comprising an inverter coupled to the output of said second OR-gate.

18. A semiconductor memory as described in claim 11 wherein said first set of lines are bit lines.

19. A semiconductor memory as described in claim 11, wherein said 2-input logic gate is an OR-gate.

20. A semiconductor memory as described in claim 11, further comprising a second repair circuit for a defective line in said second set, and a second control circuit for controlling said second repair circuit.

21. A semiconductor memory as described in claim 11, wherein said fuse is selected from the group consisting of fusible link flash memory, EPROM and EEPROM.

* * * * *